United States Patent [19]

Kobayashi et al.

[11] Patent Number: 4,852,101
[45] Date of Patent: Jul. 25, 1989

[54] APPARATUS FOR RECORDING AND/OR REPRODUCING OPTICAL CARDS

[76] Inventors: Shoei Kobayashi; Takuya Wada; Shinichi Yamamura, all of Sony Corporation, 7-35 Kitashinagawa 6-chome, Shinagawa-ku, Tokyo, all of Japan

[21] Appl. No.: 163,125
[22] Filed: Feb. 19, 1988

Related U.S. Application Data

[63] Continuation of Ser. No. 852,668, May 20, 1986, abandoned.

[30] Foreign Application Priority Data

Jul. 21, 1984 [JP] Japan ................. 59-151499
Jul. 21, 1984 [JP] Japan ................. 59-151500

[51] Int. Cl.$^4$ ................ H03M 13/00; G06F 11/10
[52] U.S. Cl. ................................ 371/40; 371/38; 235/437
[58] Field of Search ............... 371/2, 37, 38, 39, 40; 235/437; 382/57; 360/38.1, 39, 48

[56] References Cited

U.S. PATENT DOCUMENTS

| | | | |
|---|---|---|---|
| 3,775,746 | 11/1973 | Boudreau | 371/39 |
| 4,013,997 | 3/1977 | Treadwell | 235/437 X |
| 4,121,249 | 10/1978 | Lemelson | . |
| 4,206,440 | 6/1980 | Doi | 371/39 |
| 4,281,355 | 7/1981 | Wada et al. | . |
| 4,394,642 | 7/1983 | Currie | 371/40 X |
| 4,400,810 | 8/1983 | Ive | 371/40 |
| 4,646,170 | 2/1987 | Kobayashi | 371/38 X |

FOREIGN PATENT DOCUMENTS

| | | |
|---|---|---|
| 086566 | 8/1982 | European Pat. Off. . |
| 58-62807 | 4/1983 | Japan . |
| 58-153213 | 9/1983 | Japan . |
| 2080997 | 7/1980 | United Kingdom . |

OTHER PUBLICATIONS

Elektronik, vol. 32 (1983), No. 10, p. 18.
IEEE Transactions on Magnetics, vol. MAG-19 (1983), Sep., No. 5, pp. 1725-1727.
IBM J. Res. Develop., pp. 422-430 (6/27/68).

Primary Examiner—Jerry Smith
Assistant Examiner—Robert W. Beausoliel
Attorney, Agent, or Firm—Hill, Van Santen, Steadman & Simpson

[57] ABSTRACT

An apparatus for recording optical cards wherein checking words or inspection words based upon an error correction code are added to information data signals to be recorded, and signals which have been scrambled are recorded in the form of a block that can be optically read onto a belt-like optical recording medium of a card at intervals of a predetermined number of words that are distributed for a data track, and/or an apparatus for reproducing optical cards wherein signals that are read from the thus recorded optical card by a card reader, are descrambled thereby to reproduce the original data signals. Scrambling consists, for example, of so arranging the words that each is delayed by two words in the data track direction and that they are delayed by k tracks, where k is an integer, in the direction perpendicular to the data track, and placing the word at the head of the block at a position of a word number of which the phase is shifted by one word from the word number at the head of the block when the word that has reached the end of the data track is to be wrapped around to the other end and delayed, and then delaying each word by two words in the data track direction.

14 Claims, 10 Drawing Sheets

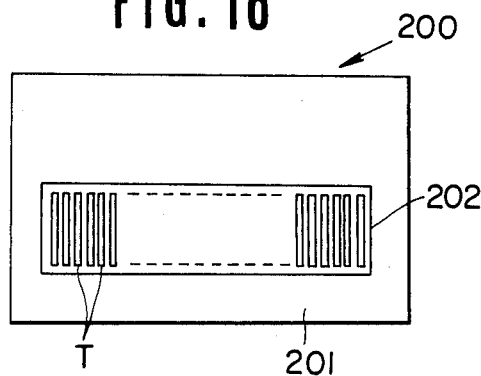
FIG. 16
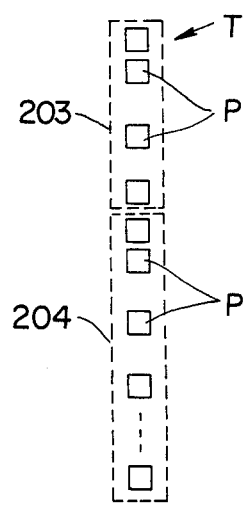
FIG. 17
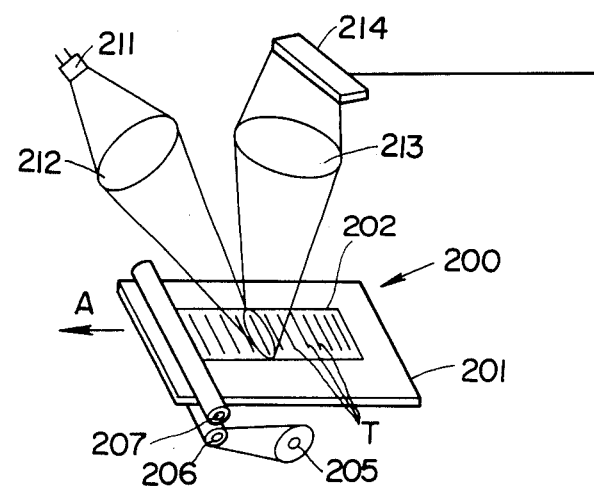
FIG. 18
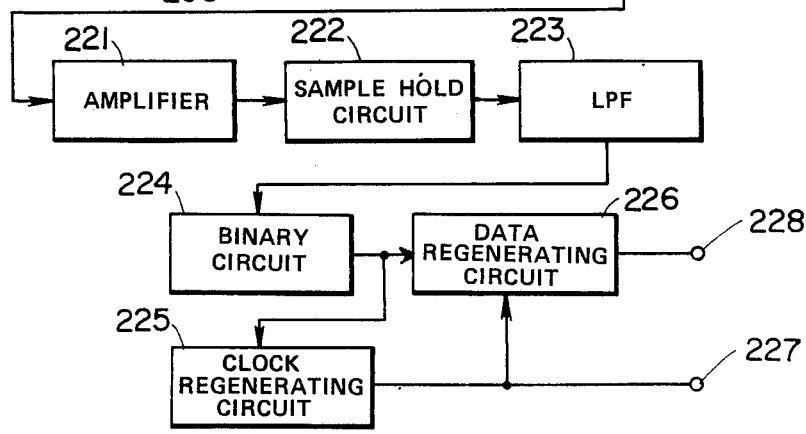

APPARATUS FOR RECORDING AND/OR REPRODUCING OPTICAL CARDS

This is a continuation of application Ser. No. 852,668 filed Mar. 20, 1986, and now abandoned.

TECHNICAL FIELD

This invention relates to an apparatus for recording and/or reproducing optical data recording cards or optical card, by which data can be recorded on and/or reproduced from the cards. More particularly, it relates to an apparatus for recording and/or reproducing data on the optical cards according to which an error correction code addition is implemented in connection with the information data to be recorded.

BACKGROUND ART

Recently, in memory cards such as bank cards, credit cards, or optical data recording cards have been developed by using optical data recording medium as data recording medium. FIG. 16 shows an example of an optical data recording card. That is to say, a band-shaped area 202 parallel to the longitudinal direction of the card on a rectangular card board 201 is formed by an optical data recording medium. Within this band-shaped area 202, a plurality of tracks T perpendicular to the longitudinal direction of the card are arranged in parallel with each other in the longitudinal direction of the card. Further, information signals are recorded on each track T in the form of so-called pit pattern or array P so as to be optically readable as shown in FIG. 17. In FIG. 17, a single track T is formed with a synchronizing signal portion 203 and a data portion 204, on both the portions of which the signal and the data are optically recorded in the form of pits P corresponding to digital signals.

The information recorded on each track within the area 202 of the optical data recording card 200 is read by an optical reading apparatus having a basic structure as shown in FIG. 18. In FIG. 18, the optical recording card 200 is fed in the longitudinal direction (the direction of arrow A) being pinched by a capstan 206 driven by a feed motor 205 and a pinch roller 207. An illumination light emitted from a light source 211 is illuminated through a condenser lens 212 upon at least one track T arranged within the band-shaped area 202 of the card. The reflected light, that is, the track reading light is allowed to be incident upon an optical sensor 214 through an objective lens 213. In general, a light emitting diode is used for the light source 211, however, it is also possible to use a lamp. As the optical sensor 214, linearly-arranged plural sensor elements (photocells) such as line sensor of charge coupled device (CCD) are used. The images projected upon the sensor elements are read on the basis of electric scanning method. Signals (track reading signals) from the optical sensor 214 are sent to a sample hold circuit 222 through an amplifier 221. Signal levels of sensor elements are sampled and held by the sample hold circuit 222 and then sent to a binary circuit 224 made up of a level discriminator through a low pass filter 223. The binary circuit 224 outputs a digital signal corresponding to the pits P on the track T. This digital signal is sent to a clock regenerating circuit 225 and a data regenerating circuit 226. Clock signals from the clock regenerating circuit 225 are sent to a clock input terminal of the data regenerating circuit 226 and further outputted through an output terminal 227. The data signal from the data regenerating circuit 226 is outputted from an output terminal 228.

In the optical data recording card 200, although the reliability of the recorded data is generally high, there exists some cases where errors occur if dust sticks onto the card. Conventionally errors are detected by adding a CRC (Cyclic Redundancy Check) code to data with one track as one block or by writing data doubly. In these methods, however, in case burst error occurs due to scratches in the direction parallel or perpendicular to the track, there exists no effect of correcting errors. This is because the card is subjected to occurrence of straight scratches in the longitudinal (perpendicular to tracks) or the lateral (parallel to tracks) direction when the card is inserted into a card case or a cummutation ticket case or when the card is inserted through a card inserting slot of the card reading apparatus. In case burst errors occur due to such straight scratches as described above, it is impossible to regenerate correct information data.

With these problems in mind, therefore, it is the primary object of the present invention to provide an apparatus for recording and/or reproducing optical cards by which it is possible to regenerate correct information data and to provide an optical data recording card having a strong error correcting capability even if burst errors occur due to straight scratches on the card.

DISCLOSURE OF THE INVENTION

A feature of the recording apparatus for the optical card according to the present invention that check words are generated on the basis of the error check code and added to the information data signals to be recorded, and in that the resulting signals are scrambled and arranged into blocks at intervals of a certain number of words allocated to a data track so as to be optically readably recorded on the band-like optical recording medium of the optical card. A feature of the reproducing apparatus for the optical card according to the present invention is that the thus recorded optical card is read at the card reader, the resulting signals are descrambled and the original information data signals are reproduced after the error corrective processing is implemented with respect to the de-scrambled signals. Further, the recording and reproducing apparatus of the present invention is capable of recording and reproducing signals in the manner described above.

Another feature of the present invention is that said scrambling consists of so arranging the words that each is delayed by two words in the data track direction and by k tracks, where k is an integer, in the direction perpendicular to the data track direction, placing the word at the position of a word number of which the phase is shifted by one word from the word number at the head of the block when the word that has reached the end of the data track is to be wrapped around to the other end and delayed, and then delaying each word by two words in the data track direction.

A further feature of the present invention is that, in a recording and/or reproducing apparatus for an optical card in which a plurality of tracks are recorded and arranged on a card board in a direction perpendicular to said tracks and in which said tracks are formed by rows of optically readable pits corresponding to digital data, the information data are arranged into blocks at intervals of the number of words of the information data to be recorded in one track, check words are generated on the basis of the first error correction code and added to each block, a first scramble operation is implemented with respect to the resulting words in such a manner that the latter are sequentially delayed by more than two words in the data track direction and more than one track in a direction perpendicular to said track data direction and, as the words have reached one end of the track and the next word is to be wrapped around to the other end of the track and delayed, it is delayed with a phase shift in the data track direction; check words are generated on the basis of the second error correction code and added to the data of each block with respect to which the first scramble operation has been implemented; and a second scramble operation is implemented with respect to the resulting words in such a manner that the latter are sequentially delayed by more than two words in the data track direction and more than one track in a direction perpendicular to said track and opposite to that at the time of the first scramble operation and, as the words have reached one ed of the track and the next word has to be wrapped around and delayed, it is delayed with a phase shift in the data track direction.

BRIEF DESCRIPTION OF THE DRAWINGS

FIGS. 1 through 5 illustrate a first embodiment of the present invention, wherein FIG. 1 shows the principle of the scramble operation; FIG. 3 is a block diagram of the recording apparatus; FIG. 3 is a block diagram showing a constructive example of the encoder and the scramble processing circuit shown in FIG. 2; FIG. 4 is a block diagram showing the reproduction device; and FIG. 5 is a block diagram showing a constructive example of the descramble processing circuit of FIG. 4.; FIG. 6 and 7 show a second embodiment of the present invention, wherein FIG. 6 is a block diagram showing encoder; and FIG. 7 is a block diagram showing the decoder. FIGS. 8 through 13 illustrate a third embodiment of the present invention, wherein FIG. 8 shows the principle of the first scramble operation; FIG. 9 shows the principle of the second scramble operation; FIG. 10 is a block diagram showing the recording device; FIG. 11 is a block circuit diagram showing a constructive example of the encoder and the scramble processing circuit shown in FIG. 10. FIG. 12 is a block diagram showing the reproduction device; and FIG. 13 is a block circuit diagram of the scramble processing circuit shown in FIG. 12. FIGS. 14 and 15 illustrate a fourth embodiment of the present invention, wherein FIG. 14 is a block diagram showing the encode; and FIG. 15 is a block diagram showing the decoder. FIG. 16 is a plan view of an optical recording card or so-called optical card. FIG. 17 shows a construction of one track. FIG. 18 shows an example of the optical reader.

BEST MODE FOR EXECUTING THE INVENTION

A preferred embodiment of an apparatus for recording and/or reproducing optical cards according to the present invention will be described with reference to the attached drawings. In the embodiment of the present invention, a synchronizing signal portion 203 and a data portion 204 are provided for a single track T as described above. The number of words in the data portion is 20 words per track; these 20 words are allocated to 16 words of information data and 4 words of error correcting parity words.

Figure 1:
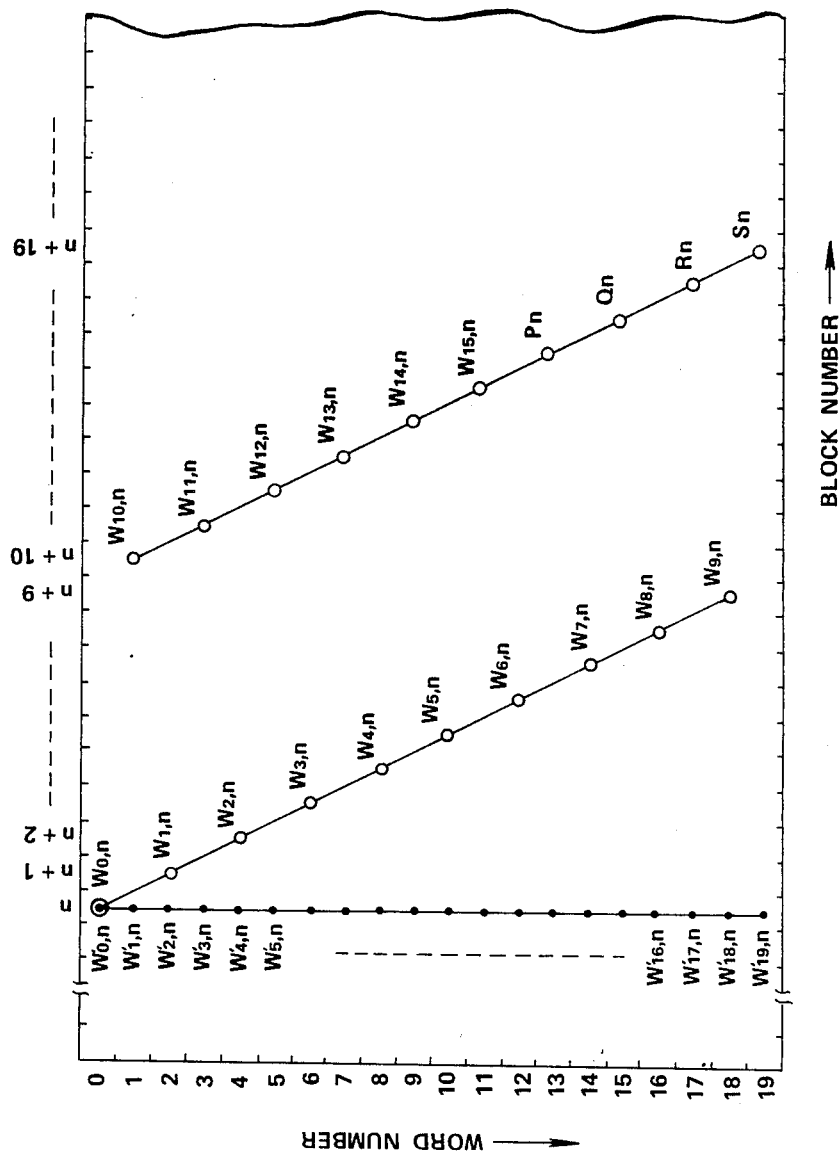

FIGS. 1 to 5 show a first embodiment of the present invention. In this first embodiment, information data to be recorded are divided into blocks each including 16 words. Each word of the n-th block information data is designated as $W_{0,n}$, $W_{1,n}$, $W_{2,n}$, ... $W_{15,n}$. To these 16 words, an error correcting code such as four parity words on the basis of C(20, 16) Reed Solomon code or four checking words $P_n$, $Q_n$, $R_n$, $S_n$ is added. The resulting 20 words are further processed by the interleave processing or scramble processing as shown in FIG. 1.

In FIG. 1, the ordinate designates word numbers; the abscissa designates block numbers. This figure is related with the track T of the optical recording cards or optical card so that the ordinate corresponds to the direction parallel to the track and the abscissa corresponds to the direction perpendicular to the track or the longitudinal direction card. With respect to the original n-th block, the 20 words ($W_{0,n}$ to $W_{15,}$, $P_n$ to $S_n$) are arranged in such a way that 2 words are delayed sequentially in the direction parallel to track (vertical direction in the drawing) and one block (one track) is delayed in the direction perpendicular to track. Further, when the 20 words arranged in the direction parallel to the track (vertical direction) are returned or wrapped around, the word arrangement is delayed by changing the phase so that no data included in one block overlap with each other. That is to say, since data are arranged being delayed by 2 words in the track direction, a word $W_{10,n}$ is returned out of the 20-word range in the track direction. The word $W_{10,n}$ is arranged at word number 1 position where the phase is shifted by one word from word number 0 (the beginning number of the block). The succeeding words are arranged in sequence being delayed by 2 words in the track direction. After the scramble processing as described above is completed, the relation between the 20 words $W'_{0,n}$ to $W'_{19,n}$ placed in one block, e.g. in the n-th block and the 20 words of the original one block, is as shown in the following Table 1.

TABLE 1

| Word | D 1 block | 2 blocks | k blocks |
|---|---|---|---|
| $W'_{0,n}$ | $W_{0,n}$ | $W_{0,n}$ | $W_{0,n}$ |
| $W'_{1,n}$ | $W_{10,n-10}$ | $W_{10,n-20}$ | $W_{10,n-10k}$ |
| $W'_{2,n}$ | $W_{1,n-1}$ | $W_{1,n-2}$ | $W_{1,n-k}$ |
| $W'_{3,n}$ | $W_{11,n-11}$ | $W_{11,n-22}$ | $W_{11,n-11k}$ |
| $W'_{4,n}$ | $W_{2,n-2}$ | $W_{2,n-4}$ | $W_{2,n-2k}$ |
| $W'_{5,n}$ | $W_{12,n-12}$ | $W_{12,n-24}$ | $W_{12,n-12k}$ |
| $W'_{6,n}$ | $W_{3,n-3}$ | $W_{3,n-6}$ | $W_{3,n-3k}$ |
| $W'_{7,n}$ | $W_{13,n-13}$ | $W_{13,n-26}$ | $W_{13,n-13k}$ |
| $W'_{8,n}$ | $W_{4,n-4}$ | $W_{4,n-8}$ | $W_{4,n-4k}$ |
| $W'_{9,n}$ | $W_{14,n-14}$ | $W_{14,n-28}$ | $W_{14,n-14k}$ |
| $W'_{10,n}$ | $W_{5,n-5}$ | $W_{5,n-10}$ | $W_{5,n-5k}$ |
| $W'_{11,n}$ | $W_{15,n-15}$ | $W_{15,n-30}$ | $W_{15,n-15k}$ |
| $W'_{12,n}$ | $W_{6,n-6}$ | $W_{6,n-12}$ | $W_{6,n-6k}$ |
| $W'_{13,n}$ | $P_{n-16}$ | $P_{n-32}$ | $P_{n-16k}$ |
| $W'_{14,n}$ | $W_{7,n-7}$ | $W_{7,n-14}$ | $W_{7,n-7k}$ |
| $W'_{15,n}$ | $Q_{n-17}$ | $Q_{n-34}$ | $Q_{n-17k}$ |
| $W'_{16,n}$ | $W_{8,n-8}$ | $W_{8,n-16}$ | $W_{8,n-8k}$ |
| $W'_{17,n}$ | $R_{n-18}$ | $R_{n-36}$ | $R_{n-18k}$ |
| $W'_{18,n}$ | $W_{9,n-9}$ | $W_{9,n-18}$ | $W_{9,n-9k}$ |
| $W'_{19,n}$ | $S_{n-19}$ | $S_{n-38}$ | $S_{n-19k}$ |

In Table 1, suffix x of $W_{x,y}$ denotes the original word number (before the first scramble processing); suffix y denotes the block number; symbol D denotes the unit delay for each word in the direction perpendicular to the track (horizontal direction), the delay unit being classified into one block, two blocks and k blocks (k: an integer). FIG. 1 shows the case where the delay unit D is 1 block. The case where D is 2 blocks will be described later in explaining the second embodiment.

By the way, since the number of tracks T within the band-shaped area 202 of the optical data recording card 200 shown in FIG. 16 is limited, it is necessary to perform a block delaying processing such that when a word arranged in sequence being delayed in the direction perpendicular to the track reaches an end track on one side in the longitudinal direction of the area 202, the word should be returned toward the other side of area 202. Further, within a range having a predetermined number of blocks (e.g. about 50 blocks), the delayed words should be returned in the direction perpendicular to the track.

The 20-word per block data words $W'_{0,n}$ to $W'_{19,n}$ obtained in this manner are what is called the cutting data and are recorded in the data portion 204 of the track T of the optical card 200.

Figure 2:
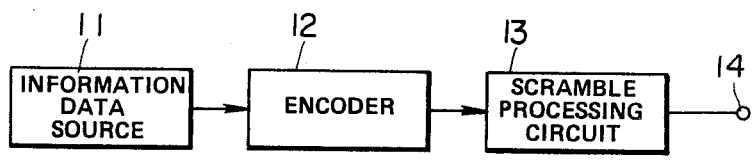

FIG. 2 is a block diagram of a recoder for implementing the above processing. The data signal having 16 words (e.g. $W_{0,n}$ to $W_{15,n}$) for each block are generated from an information data source 11 for generating information data to be recorded. The data signal is sent to an encoder 12 in which four checking words (e.g. Pn, Qn, Rn, Sn) of C(20, 16) Reed Solomon code used as the first error correcting code are added to form a data of 20 words for each block. The data from the encoder 12 is sent to a scramble processing circuit 13 for implementing the scramble processing in FIG. 1, from which the 20-word per block (e.g. $W'_{0,n}$ to $W'_{19,n}$) as listed in Table 1 are outputted at the output terminal 14. These cutting data from the output data terminal 14 are separately recorded in the respective tracks T of the band-like area 202 of the optical data recording card 200 on the block-by-block basis. At this time, one block of the data signals from the output terminal 14 are recorded on the data portion 204 of the track T while one block of the synch signal data are recorded on the synch signal portion 203 of the track T.

Figure 3:
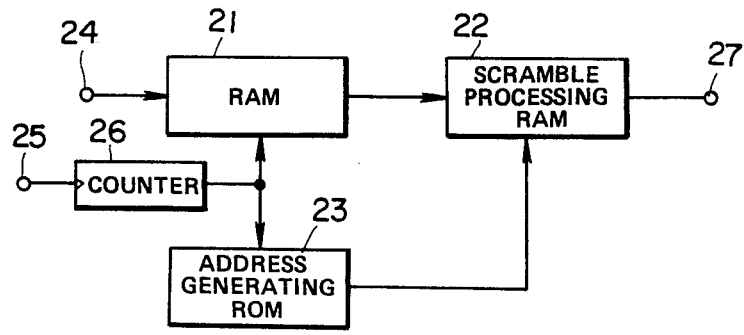

If will be noted that the encoder 12 and the scramble processing circuit 13 in FIG. 2 are configured in reality by RAM (random-access-memory) units 21, 22 and ROM (read-only-memory) unit 23 as shown in FIG. 3. That is to say, the data sent from the input terminal 24 to the RAM 21 and stored therein are processed so that checking words are added on the basis of error correction encoding process by which error correcting code of the above-mentioned C(20, 16) is added for each block. This error correction encoding process are performed by a digital signal processor (not shown). Further, a counter 26 activated in response to clock signals from the clock input terminal 25 outputs address signals for reading RAM 21 and ROM 23. In response to the address signals, the data read from the RAM 21 and the checking word data of error correcting code are sent to the next-stage scramble processing RAM 22. Data writing to the RAM 22 is controlled according to the address data sequentially read from the address generating ROM 23 on the basis of the address signal from the counter 26. That is, input data are written in sequence according to the scramble processing as shown in FIG. 1. In other words, it is possible to regard FIG. 1 as a memory map of the scramble processing RAM 22. For instance, in the RAM for implementing the scramble processing shown in FIG. 1, a RAM 22 having a capacity of plural blocks (e.g. about 50 blocks) in each of which 20 words are included is used. If a data word $W_{0,n}$ is inputted, this is written in the RAM 22 at an address (block number n; word number 0); if word $W_{1,n}$ is inputted, this is written at an address (block number n+1, word number 2), and so on. The succeeding words are written at addresses in accordance with FIG. 1. Next, when read out, data of each word $W'_{0,n}$ to $W'_{19,n}$ for each block at addresses (block number n; word number 0 to 19) are read sequentially, so that data to which the scramble processing is implemented as explained with reference to FIG. 1 can be outputted. Further, it is possible to write data into the scramble processing RAM in the order of addresses and to read the data by controlling the addresses according to the scramble processing.

Figure 4:
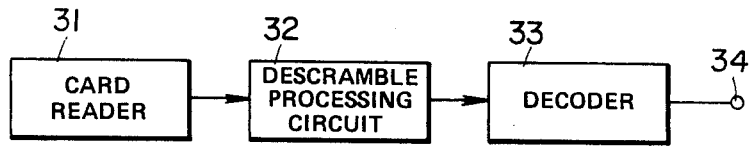

FIG. 4 shows a reproducing device for reading data recorded on the optical data recording card 200 in the block diagram form. Data signals outputted (through the output terminal 228 in FIG. 18) from a card reading apparatus or card reader 31 as shown in FIG. 18 are sent to a descramble circuit 32. This circuit 32 operates opposite to the scramble operation shown in FIG. 1. For instance 20-word data $W'_{0,n}$ to $W'_{19,n}$ for each block are supplied to this circuit 32. The circuit 32 outputs 16-word data $W_{0,n}$ to $W_{15,n}$ for each block and four-word checking word data Pn, Qn, Rn and Sn on the basis of the input data. These 20 word data for each block are sent to a decoder 33, in which error correcting processing is performed for the 16 word data $W_{0,n}$ to $W_{15,n}$ on the basis of the four checking words Pn to Sn for each block. The corrected 16 word data for each block are taken at the output terminal 34.

Figure 5:
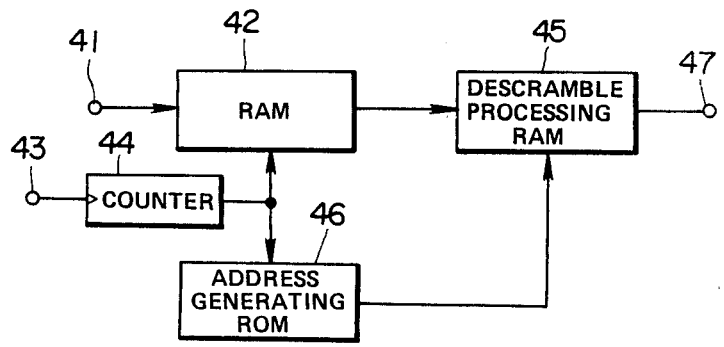

This descramble processing circuit 32 shown in FIG. 4 can be configured as shown in FIG. 5, for instance. The data sent from an input terminal 41 to a RAM 42 and stored therein are sequentially read in response to address signals from a counter 44 activated in response to clock signals inputted through a clock input terminal 43, and then sent to a scramble processing RAM 45. Further, the counted output from the counter 44 is supplied to an address terminal of an address generating ROM 46. In response to the addresses sequentially read from this ROM 46, the address for writing data in the descramble processing RAM 45 is controlled. As described above, it is possible to perform the descramble processing by controlling the addresses designated when data are written in the RAM 45 in the manner opposite to the scramble processing and by reading the data sequentially in the order of the addresses. Further, it is possible to write data into the descramble processing RAM 45 in the order of addresses and to read the data by controlling the reading addresses according to descramble processing.

Figure 6:
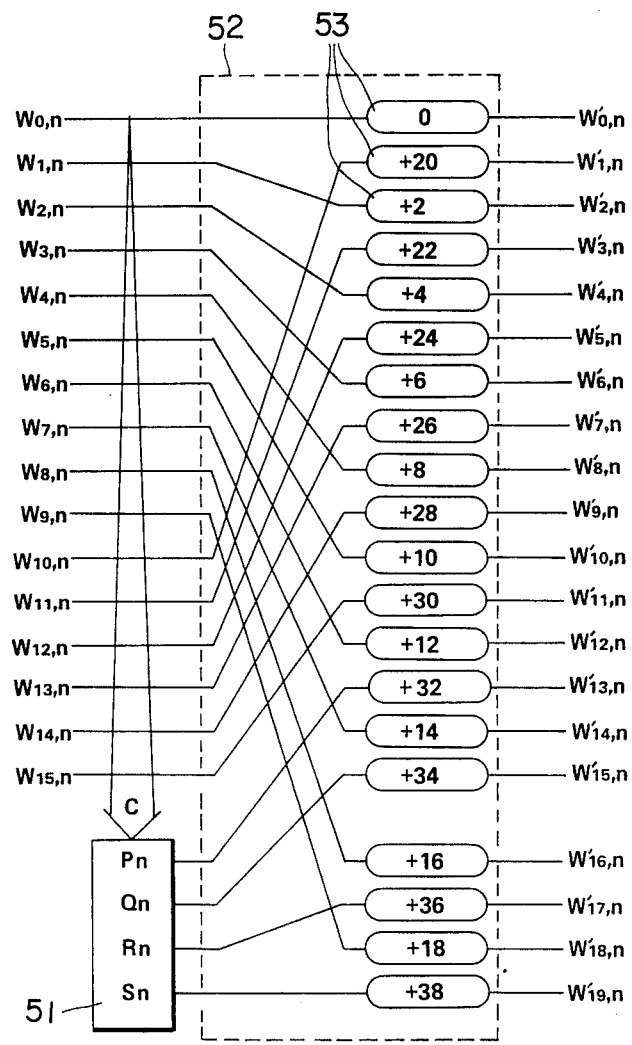
Figure 7:
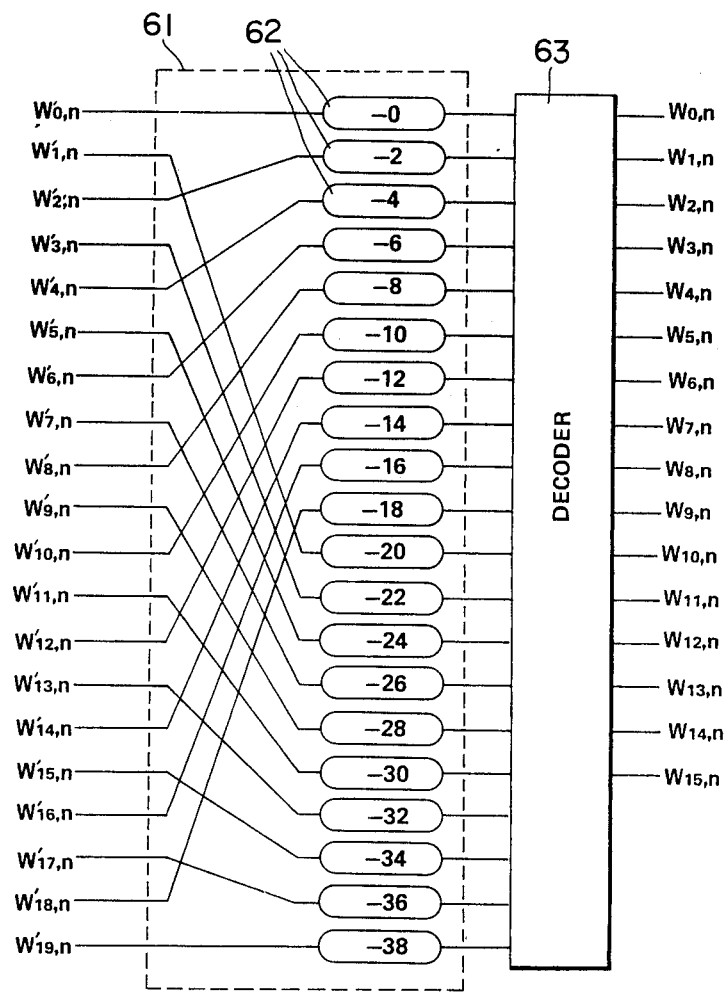

With reference to FIGS. 6 and 7, a second embodiment of the present invention will be described. In the second embodiment, the delay unit D in the direction perpendicular to the track in the first scramble processing of the first embodiment is determined to be 2 blocks.

FIG. 6 shows an encoder for obtaining what is called cutting data signals having a form suitable for being recorded on an optical recording card. Error correcting code encoding process is performed for the cutting data. In FIG. 6, information data to be recorded of 16 words for each block $W_{0,n}$, $W_{1,n}$, $W_{2,n}$ ... $W_{15,n}$ are supplied to the input side of the encoder. In the encoder 51, four checking words Pn, Qn, Rn and Sn of C(20, 16) Reed Solomon code used as the error correcting code are added to the 16-word data $W_{0,n}$ to $W_{15,n}$. These 16-word information data words $W_{0,n}$ to $W_{15,n}$ and four checking words Pn to Sn are sent to the scramble processing circuit or an interleaver 52, in which the interleave processing or the scramble processing is performed similarly to FIG. 1. However, the delay unit in the direction perpendicular to the track is determined to be 2 tracks. The digits attached to each delay means 53 within the interleaver 52 designate the delayed degree of data in block unit, respectively. The relationship between each word of the data outputted from this interleaver 52, for instance, $W'_{0,n}$, $W'_{1,n}$, $W'_{2,n}$ ... $W'_{19,n}$ and each word of the original input data corresponds to the case where the delay unit D is 2 blocks in the direction perpendicular to the track in Table 1.

As described above, it is possible to obtain what is called cutting data signals to be recorded on the data signals to be recorded on the data portion 204 of the track T of the optical recording card 200 through the interleaver 52.

Next, FIG. 7 shows a decoder for regenerating the data recorded on the optical data recording card 200. To the input side of this decoder, 20-word data $W'_{0,n}$ to $W'_{19,n}$ for each block are supplied from the data output terminal 128 of an optical reading apparatus as shown in FIG. 18. These 20-word data for each block are sent to a descramble processing circuit or deinterleaver 61, in which the processing opposite to that of the interleaver 52 of the encoder is implemented. Thereafter, the data are sent to a decoder 63 for error correcting processing and outputted as data having 16 words for each block, such as the original information data $W_{0,n}$ to $W_{15,n}$.

According to the first and second embodiments, as described hereinabove, the respective words in each block are delayed in the track direction and in the direction perpendicular to the track, while the checking words or parity words are added to these words on the basis of the error check code such as Reed Solomon code. The result is the error correction which is effective not only as to the random error but also as to the burst error caused by scratches on the card in the track direction and/or direction perpendicular to the track and the improved reliability in data reproduction.

In the first and second embodiments, the delay amounts of the words in the track direction or direction normal to the track and the word numbers per track or block can be selected as desired.

The third and fourth embodiments of the present invention will be described by referring to FIG. 8 to 15. In these embodiments, as shown in FIG. 16, a synchronizing signal portion 203 and a data portion 204 are provided in each track T, 24 words are included in the data portion in each track, these words being the 16 data words and each 4 words of 2 series of error correction parity words or checking words.

Figure 8:
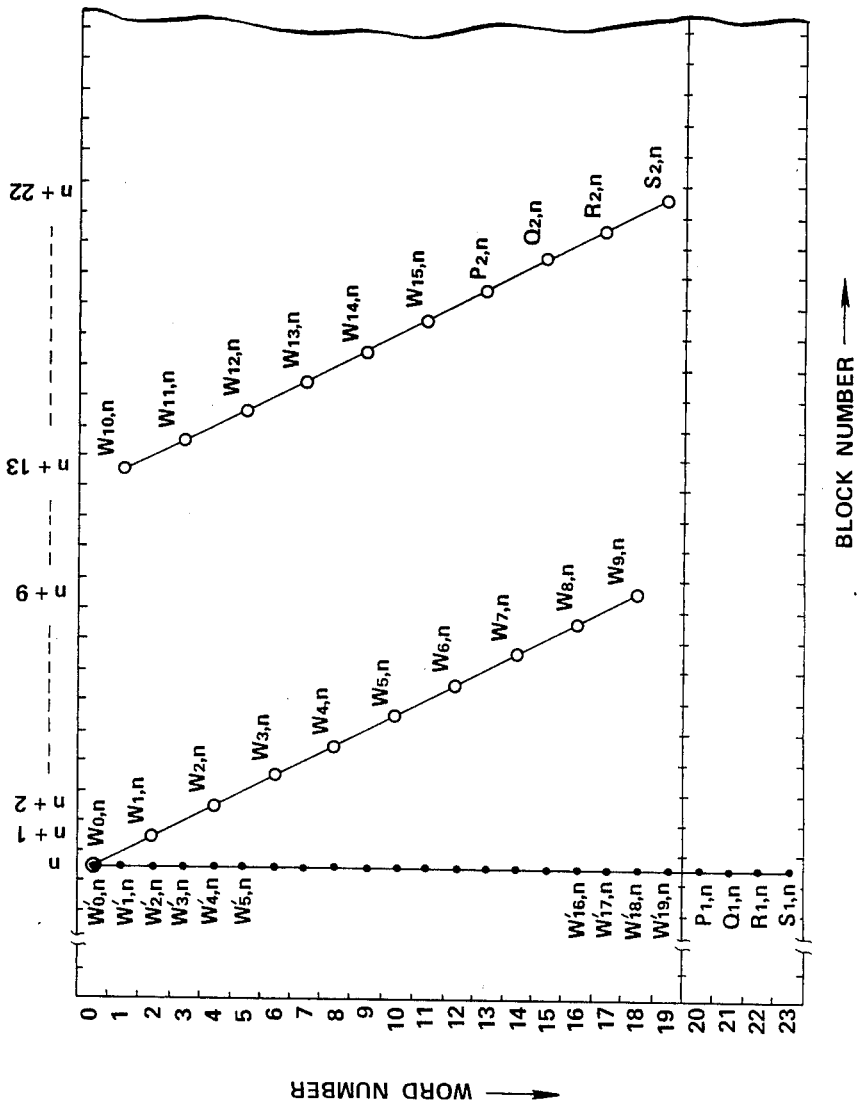

FIGS. 8 to 13 show a third embodiment of the invention. In this third embodiment, the information data to be recorded are sequentially divided at intervals of 16 words into blocks each including 16 words, with the words of the n-th block being $W_{0,n}$, $W_{1,n}$, $W_{2,n}$ ..., $W_{15,n}$. To these 16 words are added four parity words of the $C_2(20, 16)$ Reed Solomon code as the first error correction code or the check words $P_{2,n}$, $Q_{2,n}$, $R_{2,n}$ and $S_{2,n}$ to form 20 words for which a first interleaving or scrambling is implemented as shown in FIG. 8.

In FIG. 8, the ordinate indicates the word numbers and the abscissa the block numbers. This figure is related with the track T of the optical recording card or optical card so that the ordinate and the abscissa correspond to the track direction and to the direction normal thereto, that is, the direction parallel to the longitudinal direction of the cord. The 20 words of, for example, the original n-th block, that the words $W_{0,n}$ to $W_{15,n}$ and $P_{2,n}$ to $S_{2,n}$ are sequentially delayed by 2 words in the track direction, i.e. along the abscissa and by one block or track in the direction normal thereto. In addition, when the word is wrapped around within the range of the 20 words along the ordinate or in the track direction, the word is phase-shifted in the track direction so that the data within one block are not overlapped with one another in the ordinate direction. Since the words are placed in the track direction with a delay of 2 words, the word $W_{10,n}$ is outside the range of 20 words in the track direction and thus wrapped around. At this time, the word $W_{10,n}$ is placed at the position of the word number 1 phase-sifted by one word from the word number $W_{0,n}$ at the leading end of the block. The following words are then delayed sequentially by two words in the track direction. As for the delay amount along the abscissa or in the direction perpendicular to the track, the word $W_{10,n}$ just after the wrapping around is placed at the block number $n+13$ delayed by 13 blocks from the block number n of the leading word $W_{0,n}$ of the block in order to prevent the situation in which the respective words in the original block are superimposed within the same track by the second scrambling as later described. The following words are delayed sequentially by one block in the direction normal to the track direction.

The Table 2 shows the relation between the 20 words $W'_{0,n}$ to $W'_{19,n}$ of one block of the block number n after the above described first scrambling and the 20 words of the original block.

TABLE 2

| Word | D 1 block | 2 blocks | k blocks |
|---|---|---|---|
| $W'_{0,n}$ | $W_{0,n}$ | $W_{0,n}$ | $W_{0,n}$ |
| $W'_{1,n}$ | $W_{10,n-13}$ | $W_{10,n-26}$ | $W_{10,n-13k}$ |
| $W'_{2,n}$ | $W_{1,n-1}$ | $W_{1,n-2}$ | $W_{1,n-k}$ |
| $W'_{3,n}$ | $W_{11,n-14}$ | $W_{11,n-28}$ | $W_{11,n-14k}$ |
| $W'_{4,n}$ | $W_{2,n-2}$ | $W_{2,n-4}$ | $W_{2,n-2k}$ |
| $W'_{5,n}$ | $W_{12,n-15}$ | $W_{12,n-30}$ | $W_{12,n-15k}$ |
| $W'_{6,n}$ | $W_{3,n-3}$ | $W_{3,k-6}$ | $W_{3,n-3k}$ |
| $W'_{7,n}$ | $W_{13,n-16}$ | $W_{13,n-32}$ | $W_{13,n-16k}$ |
| $W'_{8,n}$ | $W_{4,n-4}$ | $W_{4,n-8}$ | $W_{4,n-4k}$ |
| $W'_{9,n}$ | $W_{14,n-17}$ | $W_{14,n-34}$ | $W_{14,n-17k}$ |
| $W'_{10,n}$ | $W_{5,n-5}$ | $W_{5,n-10}$ | $W_{5,n-5k}$ |
| $W'_{11,n}$ | $W_{15,n-18}$ | $W_{15,n-36}$ | $W_{15,n-18k}$ |
| $W'_{12,n}$ | $W_{6,n-6}$ | $W_{6,n-12}$ | $W_{6,n-6k}$ |
| $W'_{13,n}$ | $P_{2,n-19}$ | $P_{2,n-38}$ | $P_{2,n-19k}$ |
| $W'_{14,n}$ | $W_{7,n-7}$ | $W_{7,n-14}$ | $W_{7,n-7k}$ |
| $W'_{15,n}$ | $Q_{2,n-20}$ | $Q_{2,n-40}$ | $Q_{2,n-20k}$ |
| $W'_{16,n}$ | $W_{8,n-8}$ | $W_{8,n-16}$ | $W_{8,n-8k}$ |
| $W'_{17,n}$ | $R_{2,n-21}$ | $R_{2,n-42}$ | $R_{2,n-21k}$ |
| $W'_{18,n}$ | $W_{9,n-9}$ | $W_{9,n-18}$ | $W_{9,n-9k}$ |
| $W'_{19,n}$ | $S_{2,n-22}$ | $S_{2,n-44}$ | $S_{2,n-22k}$ |

In this table 2, the suffixes x, y of the word $W_{x,y}$ indicate the original word and block numbers, that is, the word and block numbers before the first scramble operation, respectively. This table shows three cases with the unit delay amounts D of the respective words along the abscissa or in a direction normal to the track direction equal to one, two and k blocks, where k is an integer. The embodiment shown in FIG. 8 corresponds to the unit delay amount D equal to 1 block. The case of D equal to 2 blocks will be described later in connection with the fourth embodiment.

The number of tracks T in the band-like area 202 of the optical card 200 shown in FIG. 16 being finite, it is necessary to implement block delaying in such a manner that the words sequentially placed with a delay in the direction normal to the track direction are wrapped around towards the other longitudinal end of the track when the words have reached the track at one longitudinal end of the area 202. The wrapping around in the direction normal to the track direction may be implemented within the range of a predetermined number of blocks (e.g. 50 blocks).

Figure 9:
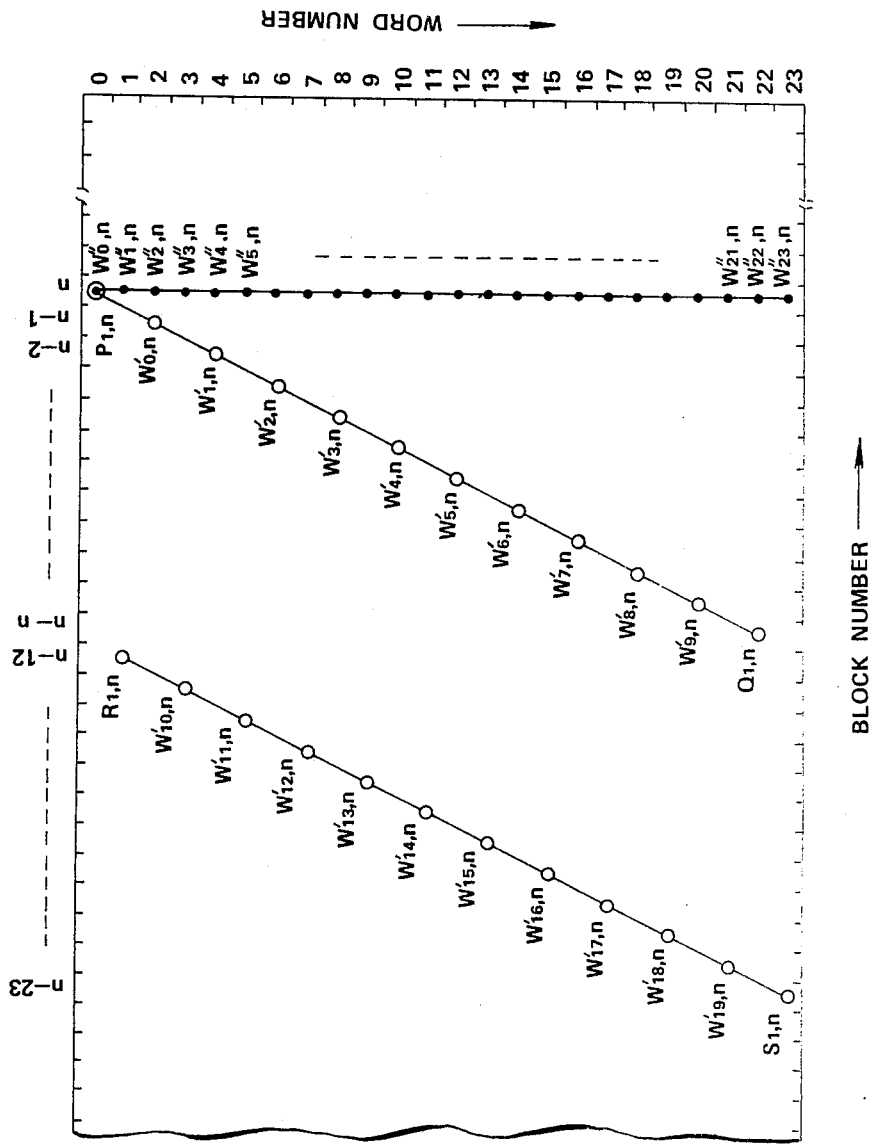

To the resulting 20-word per block words $W'_{0,n}$ to $W'_{19,n}$ are added four checking words, $P_{1,n}$, $Q_{1,n}$, $R_{1,n}$ and $S_{1,n}$ of the $C_1(24, 20)$ Reed Solomon code as the second error correction code to form 24 words to which a second interleaving or scrambling as shown in FIG. 9 is implemented.

The ordinate and the abscissa in FIG. 8 have the same meaning as those explained in connection with FIG. 8. The 24 words $W'_{0,n}$ to $W'_{19,n}$, $P_{1,n}$ to $S_{1,n}$ are delayed by 2 words along the ordinate or in the data track direction. However, along the abscissa or in a direction normal to the track direction, these 24 words are shifted one block or track in the opposite direction to that at the time of the first scrambling and, when the word within the range of 24 words along the ordinate or in the track direction is to be wrapped around, the word is delayed with a phase shift in the track direction so that the one-block data will be placed without overlapping along the ordinate. That is, since the words are placed with a delay of two words in the track direction the 13th word ($R_{1,n}$ in the example shown) is outside the range of 24 words in the track direction and has to be wrapped around. At this time, the 13th word (e.g. $R_{1,n}$) is placed at the word number 1 which is phase-shifted by one word from the word number 0 of the leading word $W_{0,n}$ of the block. The following words are sequentially delayed by 2 words in the track direction. The checking words $P_{1,n}$ to $S_{1,n}$ of the $C_1(24, 20)$ Reed Solomon code are placed at the both ends along the ordinate or in the track direction. In this manner, $P_{1,n}$, $W'_{0,n}$ to $W'_{9,n}$, $Q_{1,n}$ are placed at intervals of 2 words within the range of word numbers 0 to 22, while $R_{1,n}$, $W'_{10,n}$ to $W'_{19,n}$, $S_{1,n}$ are placed at intervals of 2 words within the range of the word numbers 1 to 23. The shift along the abscissa or in the direction normal to the track direction is such that $P_{1,n}$, $W'_{0,n}$ to $W'_{9,n}$, $Q_{1,n}$, $R_{1,n}$, $W'_{10,n}$ to $W'_{19,n}$ and $S_{1,n}$ are placed at the block numbers decreasing by one block in the above sequence of the words. Thus, when the word $P_{1,n}$ is placed at the block number n, the word $S_{1,n}$ is placed at the block $n-23$.

Table 3 shows the relation between the 24 words $W'''_{0,n}$ to $W'''_{22,n}$ of one block or track of e.g. the block number n after the second scramble operation and the same 24 words before the second scrambling operation.

TABLE 3

| Word | D −1 block | −2 blocks | −k blocks |
|---|---|---|---|
| $W'''_{0,n}$ | $P_{1,n}$ | $P_{1,n}$ | $P_{1,n}$ |
| $W'''_{1,n}$ | $R_{1,n+12}$ | $R_{1,n+24}$ | $R_{1,n+12K}$ |
| $W'''_{2,n}$ | $W'_{0,n+1}$ | $W'_{0,n+2}$ | $W'_{0,n+k}$ |
| $W'''_{3,n}$ | $W'_{10,n+13}$ | $W'_{10,n+26}$ | $W'_{10,n+13k}$ |
| $W'''_{4,n}$ | $W'_{1,n+2}$ | $W'_{1,n+4}$ | $W'_{1,n+2k}$ |
| $W'''_{5,n}$ | $W'_{11,n+14}$ | $W'_{11,n+28}$ | $W'_{11,n+14K}$ |
| $W'''_{6,n}$ | $W'_{2,n+3}$ | $W'_{2,n+6}$ | $W'_{2,n+3k}$ |
| $W'''_{7,n}$ | $W'_{12,n+15}$ | $W'_{12,n+30}$ | $W'_{12,n+15K}$ |
| $W'''_{8,n}$ | $W'_{3,n+4}$ | $W'_{3,n+8}$ | $W'_{3,n+4k}$ |
| $W'''_{9,n}$ | $W'_{13,n+16}$ | $W'_{13,n+32}$ | $W'_{13,n+16k}$ |
| $W'''_{10,n}$ | $W'_{4,n+5}$ | $W'_{4,n+10}$ | $W'_{4,n+5k}$ |
| $W'''_{11,n}$ | $W'_{14,n+17}$ | $W'_{14,n+34}$ | $W'_{14,n+17k}$ |
| $W'''_{12,n}$ | $W'_{5,n+6}$ | $W'_{5,n+12}$ | $W'_{5,n+6k}$ |

TABLE 3-continued

| Word | D −1 block | −2 blocks | −k blocks |
|---|---|---|---|
| $W'''_{13,n}$ | $W'_{15,n+18}$ | $W'_{15,n+36}$ | $W'_{15,n+18k}$ |
| $W'''_{14,n}$ | $W'_{6,n+7}$ | $W'_{6,n+14}$ | $W'_{6,n+7k}$ |
| $W'''_{15,n}$ | $W'_{16,n+19}$ | $W'_{16,n+38}$ | $W'_{16,n+19k}$ |
| $W'''_{16,n}$ | $W'_{7,n+8}$ | $W'_{7,n+16}$ | $W'_{7,n+8k}$ |
| $W'''_{17,n}$ | $W'_{17,n+20}$ | $W'_{17,n+40}$ | $W'_{17,n+20k}$ |
| $W'''_{18,n}$ | $W'_{8,n+9}$ | $W'_{8,n+18}$ | $W'_{8,n+9k}$ |
| $W'''_{19,n}$ | $W'_{18,n+21}$ | $W'_{18,n+42}$ | $W'_{18,n+21k}$ |
| $W'''_{20,n}$ | $W'_{9,n+10}$ | $W'_{9,n+20}$ | $W'_{9,n+10k}$ |
| $W'''_{21,n}$ | $W'_{19,n+22}$ | $W'_{19,n+44}$ | $W'_{19,n+22k}$ |
| $W'''_{22,n}$ | $Q_{1,n+11}$ | $Q_{1,n+22}$ | $Q_{1,n+11k}$ |
| $W'''_{23,n}$ | $S_{1,n+23}$ | $S_{1,n+46}$ | $S_{1,n+23k}$ |

In this table, the suffixes x, y of $W'_{x,y}$ indicate the original word and block numbers, that is, before the second scrambling, and the cases in which the unit delay D of the respective words along the abscissa or in the direction normal to the track direction is set to be equal to $-1$, $-2$ and $-k$ blocks, where k is an integer. The example of FIG. 9 is relevant to case in which the delay D is equal to $-1$ block. The case in which D is equal to $-2$ blocks will be explained as the fourth embodiment.

The 24-word per block data, for example, the words $W'''_{0,n}$ to $W'''_{23,n}$ are recorded as what is called the cutting data on the data portion 204 of one track T of the optical card 200. The words $W'''_{0,n}$, $W'''_{1,n}$, $W'''_{22,n}$ and $W'''_{23,n}$ at the both extreme positions in the track direction or along the ordinate in FIG. 9 correspond to the checking words $P_1$, $R_1$, $Q_1$, and $S_1$ of the error check code.

Figure 10:
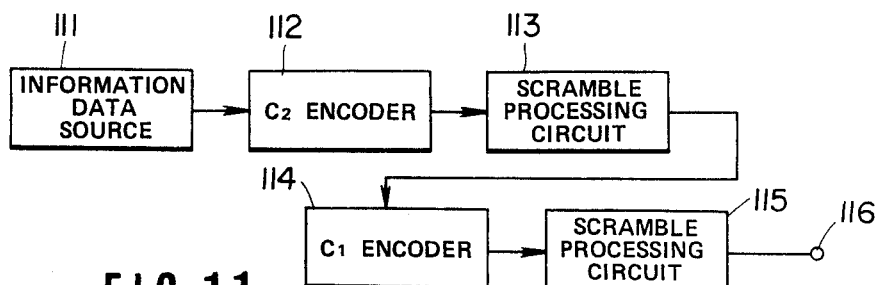

FIG. 10 is a block diagram showing how the recording apparatus for performing the above operation is configured. The 16-word per block data signals from a data source 111 adapted to produce the information data to be recorded are transmitted to a $C_2$-encoder 112 adapted in turn to produce four checking words, such as $P_{2,n}$, $Q_{2,n}$, $R_{2,n}$ and $S_{2,n}$ of the $C_2(20, 16)$ Reed Solomon code as the first error correction code. The 20-word per block data outputted from the $C_2$-encoder 112 are transmitted to a first scramble circuit 113 adapted to perform the scrambling operation shown in FIG. 8. In this manner, the 20 word per block words, such as $W'_{0,n}$ to $W'_{19,n}$ shown in Table 2, are outputted. The 20-word per block data which have passed through the first scrambling are transmitted to a $C_1$-encoder 114 adapted to produce four checking words, such as $P_{1,n}$, $Q_{1,n}$, $R_{1,n}$ and $S_{1,n}$ of the Reed Solomon code as the aforementioned second error correction code. The 24-word per block data outputted from the $C_1$-encoder 114 are transmitted to a scrambling circuit 115 shown in FIG. 9 and thereby turned into 24-word per block words, such as $W'''_{0,n}$ to $W'''_{23,n}$ shown in Table 3 so as to be outputted at the output terminal 116. These cutting data from the output terminal 116 are then recorded blockwise on the respective tracks T of the band-like area 202 of the optical card 200. It is noted that the one-block data from the output terminal 116 and the synchronizing signal data are recorded in the data portion 204 and in the synchronizing signal portion 203 of a given track T, respectively.

Figure 11:
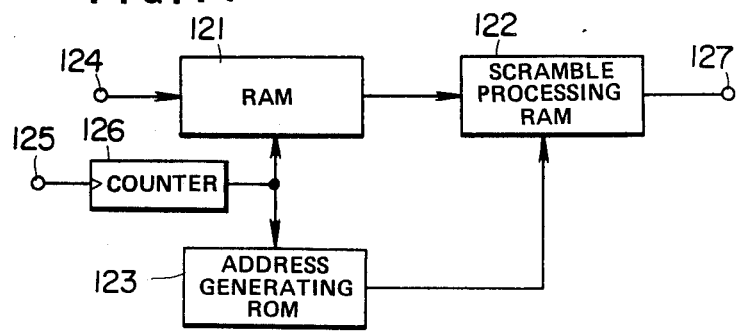

It is noted that the $C_2$-encoder 112, scrambling circuit 113, $C_1$-encoder 114 and scrambling circuit 115 in FIG. 10 are configured in reality by RAM units (random access memory units), 121, 122 and a ROM unit (read only memory unit) 123 as shown in FIG. 11. That is, the $C_2(20, 16)$ or $C_1(24, 20)$ error check coding is implemented on the block-by-block basis for data supplied to and stored in the RAM 121 from the input terminal 124, so that checking words are added to the data. This error correction code processing is carried out in, for example, a digital signal processor, not shown. A counter 126 activated for counting responsive to clock signals from a clock input terminal 125 outputs read address signals for the RAM 121 and ROM 123. The check word data of the error check code and the data read from the RAM 121 responsive to these address signals are transmitted to the next stage scrambling RAM 122. Data writing into the RAM 122 is controlled responsive to the address data sequentially read from ROM 123 by the address signals supplied from the counter 126, in such a manner that the input data are sequentially written into the addresses in accordance with the scramble operation as shown in FIGS. 8 or 9. In other words, it is possible to regard FIGS. 8 or 9 as a memory map of the scramble processing RAM 122. Suppose that a RAM 122 having a memory capacity of a plurality of, such as 50, blocks, with each block consisting of 20 words, is used as the RAM for implementing the scramble operation shown in FIG. 8. If a data of the word $W_{0,n}$ is inputted, this is written into the address (block number n; word number 0) in the RAM 122; similarly, if a data of the word $W_{1,n}$ is inputted, this is written into an address (block number n+1; word number 2) and so on. The succeeding words are written in addresses in accordance with FIG. 8. Next, when read out, data of each word $W'_{0,n}$ to $W'_{19,n}$ for the n-th block of the word numbers 0 to 19 are read sequentially so that data to which the first scramble processing is implemented as explained with reference to FIG. 8 can be outputted from the output terminal 127. The second scramble operation can be implemented similarly. Further, it is possible to write data into the scramble processing RAM in the order of addresses and to read the data by controlling the addresses according to the scramble processing.

Figure 12:
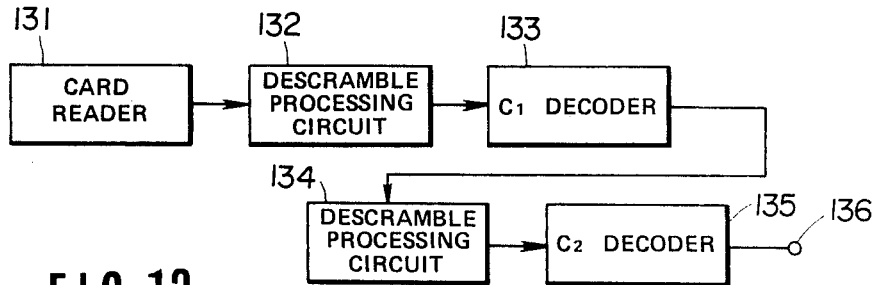

FIG. 12 shows a decoder for reading data recorded on the optical recording card 200 in the block form. Data signals from card reader 131 shown in FIG. 18, that is, signals from the output terminal 228 of FIG. 18, are transmitted to the descramble processing circuit 132, whose operation is the reverse of the second scramble processing shown in FIG. 9. For example, the 24-word data such as $W''_{0,n}$ to $W''_{23,n}$ for each block are sent to the descramble processing circuit 132, where the input data of the respective blocks are processed to output 20-word per block data $W'_{0,n}$ to $W'_{19,n}$ and 4-word checking data $P_{1,n}$, $Q_{1,n}$, $R_{1,n}$ and $S_{1,n}$. These 24-word per block data are sent to a $C_1$-decoder (33 where the error correction processing is implemented with respect to the 20 words $W'_{0,n}$ to $W'_{19,n}$ on the basis of the four checking words $P_{1,n}$ to $S_{1,n}$ per block. The 20-word per block data thus corrected for data error are transmitted to a descramble processing circuit 134 where the 16-word information data $W_{0,n}$ to $W_{15,n}$ and the 4-word checking data $P_{2,n}$, $Q_{2,n}$, $R_{2,n}$ and $S_{2,n}$ are produced by the operation which is the reverse of the first scramble processing shown in FIG. 8. These data are transmitted to the $C_2$-decoder 135 where the error correction processing of the 16-word information data $W_{0,n}$ to $W_{15,n}$ is implemented on the basis of the 4 checking words $P_{2,n}$ to $S_{2,n}$ for each block. The 16-word per block information data thus corrected for data error are transmitted to an output terminal 136.

Figure 13:
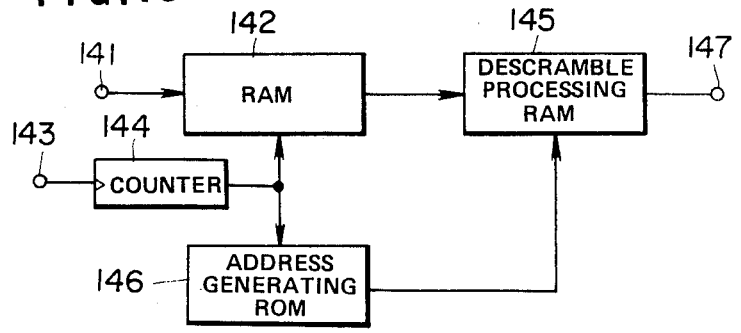

The descramble processing circuits 132, 134 in the reproducing apparatus shown in FIG. 12 may be configured as shown for example in FIG. 13. The data transmitted from the input terminal 141 shown in FIG. 13 to the RAM 142 to be stored there are sequentially read out by address signals from a counter 144 activated for counting by each clock signal from the clock input terminal 143, and are transmitted to a descramble processing RAM 145. The count output from the counter 144 is supplied to an address terminal of an address generating ROM 146 from which the addresses may sequentially read out to control the writing addresses for writing into RAM 145. Data writing addresses into RAM 145 are controlled by the operation which is the reverse of the scramble processing described above so that the data are sequentially read out in the sequence of the addresses at the time of data reading to perform the descramble processing. Alternatively, data may be written into RAM 145 in the sequence of the addresses and read out by the read address control in accordance with the descramble processing.

The fourth embodiment of the present invention will be described by referring to FIGS. 14 and 15. In the present fourth embodiment, the unit delay D in the direction normal to the track at the time of the third scramble processing for third embodiment is set to be 2 blocks and the unit delay D in the direction normal to the track at the time of the second scramble processing is set to be −2 blocks.

Figure 14:
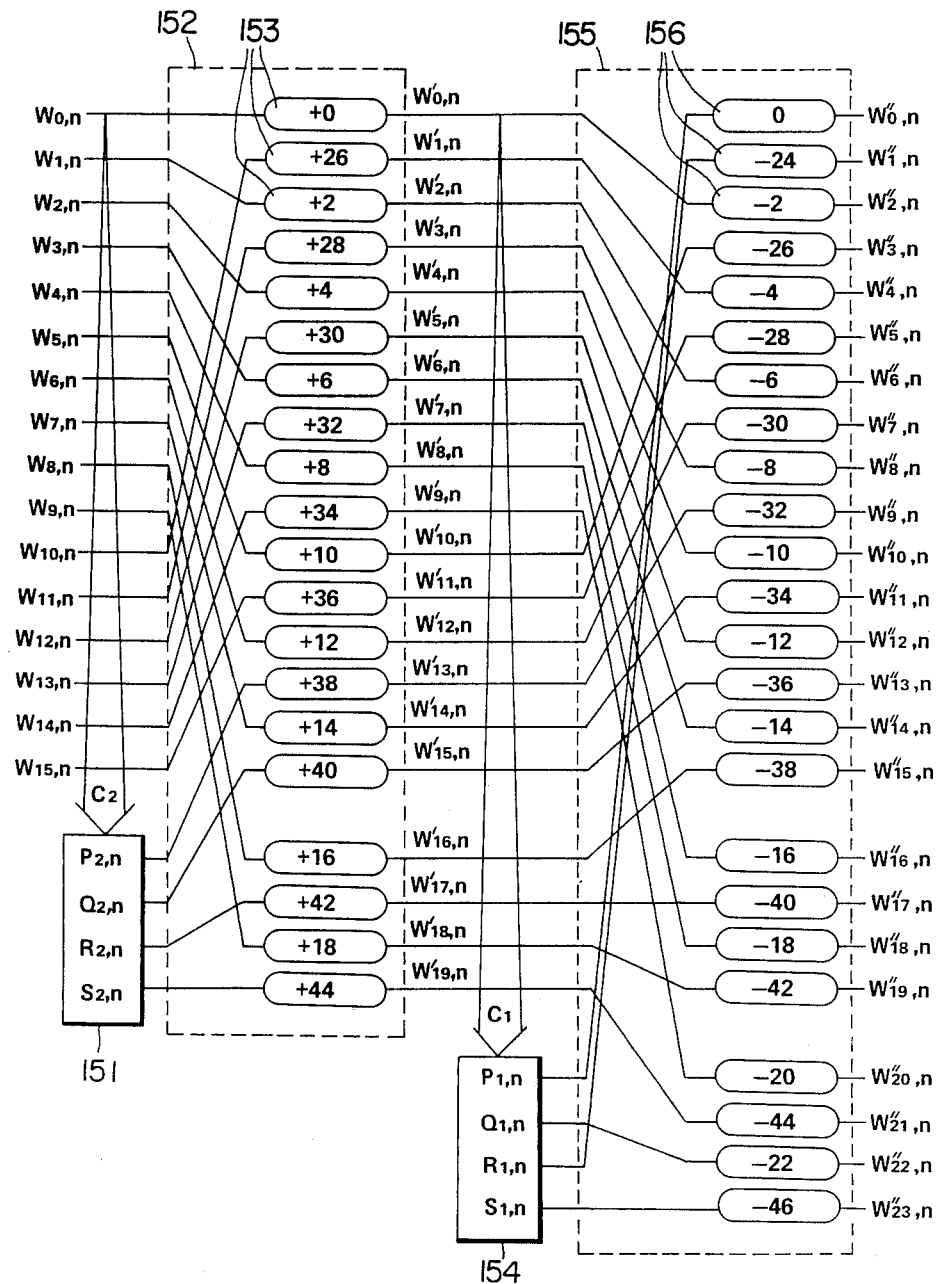

FIG. 14 shows an encoder for producing what is called the cutting data signals, that is, the data signals composed of the information signals to be stored and recorded on the optical card with the error correction code processing. Referring to this figure, the 16-word information data, for example, $W_{0,n}$, $W_{1,n}$, $W_{2,n}$, ..., $W_{15,n}$ are supplied to the input side of the encoder for recording. In the first encoder 151, four checking words $P_{2,n}$, $Q_{2,n}$, $R_{2,n}$, and $S_{2,n}$ of the first error correction code, that is, the $C_2(20, 16)$ Reed Solomon code, are generated for these 16 words $W_{0,n}$ to $W_{15,n}$. These 16 information data words $W_{0,n}$ to $W_{15,n}$ and the four checking words $P_{2,n}$, $Q_{2,n}$, $R_{2,n}$ and $S_{2,n}$ are transmitted to the first scramble processor or interleaver where the interleaving or scrambling similar to that explained with reference to FIG. 8 in performed with the exception that the unit delay D in the direction normal to the track direction is set to be equal to two tracks. In FIG. 15, the numerals entered in each oblong circle of the delay means 153 of the interleaver 152 denotes the data delay in terms of the number of blocks. The relation between the respective words of the data outputted from the interleaver 152, for example, the words $W'_{0,n}$, $W'_{1,n}$, $W'_{2,n}$, ..., $W'_{19,n}$ and the respective words of the original input data corresponds to the case in which the unit delay D in the direction normal to the track in Table 2 is equal to 2 blocks. Then, four checking words $P_{1,n}$, $Q_{1,n}$, $R_{1,n}$ and $S_{1,n}$ of the second error correction code, that is, the $C_1(24, 20)$ Reed Solomon code, are generated in the second encoder 154 and added to the 20-word per block data from the interleaver 152, the resulting 24-word per block data being then transmitted to the second scramble processor or interleaver 155, where the interleaving or scrambling operation similar to that of FIG. 9 is performed, with D being set to −2 blocks. The relation between the respective words of the output data from the interleaver 155, such as $W''_{0,n}$ to $W''_{23,n}$ and the respective words of the input data to the interleaver corresponds to the case in which D shown in Table 3 is equal to −2 blocks. The numerals entered in each oblong circle of the delay means 156 in the interleaver 159 indicates the delay of the input data in terms of the number of blocks or tracks.

In this manner, there are obtained from the interleaver 155 the so-called cutting data signals to be recorded on the track T or, more precisely, on the data portion 204 of the Track T of the optical data recording card 200.

Figure 15:
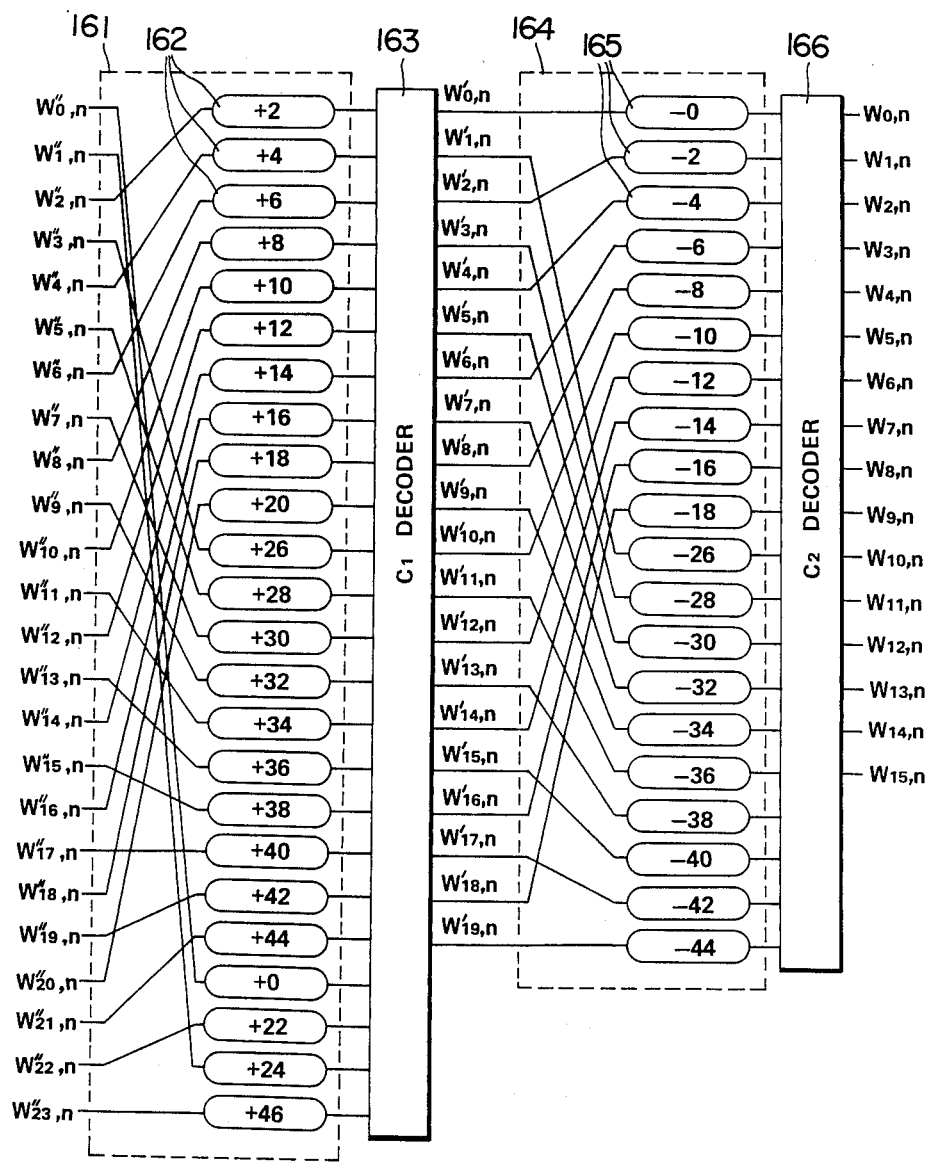

FIG. 15 shows a reproducing side decoder, that is, a decoder for reproducing the data recorded on the optical data recording card 200. To the input side of the decoder are supplied 24-word per block data, such as words $W''_{0,n}$ to $W''_{23,n}$ from the data output terminal 228 of the card reader shown in FIG. 18. These 24-word per block data are transmitted to a descramble processor or interleaver 161 where operation reverse to that of the interleaver of the encoder is performed. The data are then transmitted to the $C_1$-decoder 16e for error correction and outputted in the form of 20-word per block data. These 20-word per block data, such as the words $W'_{0,n}$ to $W'_{19,n}$ are transmitted to the descramble processor or interleaver 164 where the operation reverse to that of the interleaver 152 of the encoder is performed. The data are then sent to the $C_2$-decoder 166 for error correction. Thus there are outputted from the $C_2$-decoder 166 the original information data signals for which two sets of the interleaving and error correction operation have been implemented, for example, the 16-word original information data signals for each block, are outputted. The numerals entered in an oblong circle of each delay means 161, 164 denotes a data delay in terms of the number of blocks or tracks.

In the above described third and fourth embodiments of the present invention, the words are delayed in both the data track direction and in the direction perpendicular thereto, while the two sets of scramble processing operation is performed so that the interleaving direction will cross each other for implementing double error correction code processing. In this manner, the apparatus is invulnerable not only to the random error but to the burst error in both the track direction and the direction perpendicular thereto with the result that the information data may be reproduced with higher reliability. Also, since the checking words of the second error correction code are placed at both ends of the data track, the information data of the first error correction code or the information data are not affected by the errors caused at the error susceptible track end portions thus resulting in an elevated error correction efficiency.

The present invention is not limited to the above embodiments. For example, the delay values in both the track direction and the direction perpendicular thereto at the time of the first scrambling need not be coincident with those in the track direction and the direction perpendicular thereto at the time of the second scrambling. The number of information data words or that of the checking words of the error correction code can be set in any desired manner. Other modifications can naturally be made without departing from the scope of the present invention.

What is claimed is:

1. An apparatus for recording optical record cards having optical recording media for storing recorded information data signals as a plurality of data tracks parallel to one another in the form of pit patterns so as to be optically readable, comprising:

an information data source for producing said information data signals to be recorded on each said data tracks;

means for manifesting an error correction code;

an encoder means including means for generating checking words on the basis of said error correction code and adding said checking words to output signals from said data source, and a scramble processing circuit for scramble processing output signals from said encoder, said scramble processing circuit comprising means for arranging the words so that each word is delayed by two words in the data track direction and by k tracks, where k is an integer, in the direction perpendicular to the data track, and for placing the word at a position of a word number of which the phase is shifted by one word from the word number at the head of the block when the word that has reached the end of the data track is to be wrapped around to the other end and delayed, and then delaying each word by two words in the data track direction, said scramble processing circuit comprising a first random access memory for storing data received from said encoder with said checking words, a second random access memory for said scramble processing, a read only memory for generating writing addressed for writing to said second random access memory, and counter means for generating read addresses for said first random access memory and said read only memory, the output signals from said encoder means being arranged in the form of blocks at intervals of the number of words allocated to one data track.

2. An apparatus for recording optical record cards according to claim 1 characterized in that the value of k is equal to 1.

3. An apparatus for recording optical record cards according to claim 1 characterized in that the value of k is equal to 2.

4. An apparatus for recording and reproducing optical record cards having optical recording media for storing recorded information data signals as a plurality of data tracks parallel to one another in the form of pit patterns so as to be optically readable, comprising:

an information data source for producing said information data signals to be recorded on each said data tracks;

means for manifesting an error correction code;

an encoder means including means for generating checking words on the basis of said error correction code and adding said checking words to output signals from said data source, and a scramble processing circuit for scramble processing output signals from said encoder, comprising means for arranging the words so that each word is delayed by two words in the data track direction and by k tracks, where k is an integer, in the direction perpendicular to the data track, and for placing the word at a position of a word number of which the phase is shifted by one word from the word number at the head of block when the word that has reached the end of the data track is to be wrapped around to the other end and delayed, and then delaying each word by two words in the data track direction;

a decoder means including a descramble processing circuit for implementing a descramble processing with respect to the output signals from a card reader and a decoder for implementing an error correction processing with respect to the output signals from said descramble processing circuit; said scramble processing circuit comprising a first random access memory for storing data received from said encoder with said checking words, a second random access memory for scramble processing, a first read only memory for generating write address for writing to said second random access memory, and first counter means for generating read addresses for said first random access memory and said first read only memory; said descramble processing circuit further Comprising a third random access memory for storing read-out data, a fourth random access memory for said descramble processing, a second read only memory for generating write addresses for writing into said fourth random access memory, and second counter means for generating read addresses for reading from said third random access memory and said second read only memory.

5. An apparatus for recording and reproducing optical record cards according to claim 4 characterized in that the value of k is equal to 1.

6. An apparatus for recording and reproducing optical record cards according to claim 4 characterized in that the value of k is equal to 2.

7. An apparatus for recording optical record cards having optical recording media for storing recorded information data signals as a plurality of data tracks parallel to one another in the form of pit patterns so as to be optically readable, comprising:

an information data source for producing said information data signals to be recorded on each said data tracks;

means for manifesting first and second error correction codes;

an encoder means including first encoder means for generating checking words on the basis of said first error correction code and adding said checking words to output signals from said source, a first scramble processing circuit for implementing a first scramble processing with respect to output signals from said first encoder, a second encoder for generating checking words on the basis of said second error correction code and adding said checking words to output signals from said first scramble processing circuit, and a second scramble processing circuit for implementing second scramble processing with respect to output signals from said second encoder, said first scramble processing circuit comprising means for arranging the words so that each word is delayed by two words in the data track direction and by k tracks, where k is an integer, in the direction perpendicular to the data track, and for placing the word at position of a word number of which the phase is shifted by one word from the number at the head of the block when the word that has reached the end of the data track is to be wrapped around to the other end and delayed, and then delaying each word by two words in the data track direction, and said second scramble processing circuit comprising means for arranging the words so that each word is delayed by two words in the data track direction and by k tracks, where k is an integer, in the direction perpendicular to the data track and opposite to that at the time of said first scramble processing, and for placing the word at a position of a word number of which the phase is shifted by one word from the word number at the head of the block when the word that has reached the end of the data track is to be wrapped around to the other end and delayed, and then delaying each word by two words in the data track direction, said first and second scramble processing circuits including a first random access memory for storing data from said encoder with said checking words, a second random access memory for said scramble processing, a read only memory for generating write addresses for writing to said second random access memory, and counter means for generating read addresses for reading from said first random access memory and said read only memory, the output signals from said encoder means being arranged in the form of blocks at intervals of a number of words allocated to one data track.

8. An apparatus for recording optical record cards according to claim 7 characterized in that the checking words by said second encoder are placed at the both ends of said data track.

9. An apparatus for recording optical record cards according to claim 7 characterized in that the value of k is equal to 1.

10. An apparatus for recording optical record cards according to claim 7 characterized in that the value of k is equal to 2.

11. An apparatus for recording and reproducing optical record cards having optical recording media for storing recorded information data signals as a plurality of data tracks parallel to one another in the form of pit patterns so as to be optically readable comprising:

an information data source for producing said information data signals to be recorded on each said data tracks;

means for manifesting first and second error correction codes;

an encoder means including first encoder means for generating checking words on the basis of said first error correction code and adding said checking words to output signals from said source, a first scramble processing circuit for implementing a first scramble processing with respect to output signals from said first encoder, a second encoder for generating checking words on the basis of said second error correction code and adding said checking words to output signals from said first scramble processing circuit, and a second scramble processing circuit for implementing a second scramble processing with respect to output signals from said second encoder, said first scramble processing circuit comprising means for arranging the words so that each word is delayed by two words in the data track direction and by k tracks, where k is an integer, in the direction perpendicular to the data track, and for placing the word at a position of a word number of which the phase is shifted by one word from the word number at the head of block when the word that has reached the end of the data track is to be wrapped around to the other end and delayed, and then delaying each word by two words in the data track direction, and said second scramble processing circuit comprising means for arranging the words so that each word is delayed by two words in the data track direction and by k tracks, where k is an integer, in the direction perpendicular to the data track and opposite to that at the time of said first scramble processing, and for placing the word at a position of a word number of which the phase is shifted by one word from the word number at the head of the block when the word that has reached the end of the data track is to be wrapped around to the other end and delayed, and then delaying each word by two words in the data track direction;

a reader for said optical record cards; and a decoder means including a second descramble processing circuit for implementing a second descramble processing corresponding to said second scramble processing with respect to the output signals from said reader, a second decoder for implementing a second error correction processing corresponding to said second error correction code with respect to the output signals from said second descramble processing circuit, a first descramble processing corresponding to said first scramble processing with respect to output signals from said second decoder, and a first decoder for implementing a first error correction processing corresponding to said first error correction code with respect to output signals from said first descramble processing circuit, said first and second scramble processing circuits including a first random access memory for storing data for which the error correction code processing has been implemented by the addition of checking words, a second random access memory for scramble processing, a first read only memory for generating write addresses for writing to said second random access memory, and first counter means for generating read addresses for said first random access memory and said first read only memory, said first and second descramble processing circuits including a third random access memory for storing read-out data, a fourth random access memory for descramble processing, a second read only memory for generating write addresses for writing into said fourth random access memory, and second counter means for generating read addresses for reading from said third random access memory and said second read only memory.

12. An apparatus for recording and reproducing optical record cards according to claim 11 characterized in that the checking words by said second encoder are placed at the both ends of the data track.

13. An apparatus for recording and reproducing optical record cards according to claim 11 characterized in that the value of k is equal to 1.

14. An apparatus for recording and reproducing optical record cards according to claim 11 characterized in that the value of k is equal to 2.

* * * * *